(12) United States Patent
Chi

(10) Patent No.: US 6,828,211 B2
(45) Date of Patent: Dec. 7, 2004

(54) SHALLOW TRENCH FILLED WITH TWO OR MORE DIELECTRICS FOR ISOLATION AND COUPLING OR FOR STRESS CONTROL

(75) Inventor: Min-Hwa Chi, Hsin-chu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 98 days.

(21) Appl. No.: 10/262,168

(22) Filed: Oct. 1, 2002

(65) Prior Publication Data

US 2004/0063300 A1 Apr. 1, 2004

(51) Int. Cl.[7] .................. H01L 21/76; H01L 21/302; H01L 21/4763
(52) U.S. Cl. .................. 438/424; 438/618; 438/675; 438/740
(58) Field of Search .................. 438/424, 401, 438/618, 675, 740, 763, 692, 745, 756, 757, 780

(56) References Cited

U.S. PATENT DOCUMENTS

| | | | | |
|---|---|---|---|---|
| 4,571,819 A | * | 2/1986 | Rogers et al. | 438/430 |
| 4,656,497 A | * | 4/1987 | Rogers et al. | 257/397 |
| 5,081,516 A | * | 1/1992 | Haskell | 257/384 |
| 5,091,326 A | * | 2/1992 | Haskell | 438/257 |
| 5,112,772 A | * | 5/1992 | Wilson et al. | 438/426 |
| 5,742,091 A | | 4/1998 | Hébert | 257/531 |
| 6,001,740 A | * | 12/1999 | Varian et al. | 438/692 |
| 6,037,237 A | | 3/2000 | Park et al. | 438/424 |
| 6,057,207 A | * | 5/2000 | Lin et al. | 438/424 |
| 6,074,909 A | | 6/2000 | Gruening | 438/242 |
| 6,147,394 A | * | 11/2000 | Bruce et al. | 257/506 |
| 6,194,283 B1 | | 2/2001 | Gardner et al. | 438/424 |
| 6,251,747 B1 | * | 6/2001 | Zheng et al. | 438/424 |
| 6,255,176 B1 | | 7/2001 | Kim et al. | 438/296 |
| 6,297,128 B1 | | 10/2001 | Kim et al. | 438/437 |
| 6,326,281 B1 | * | 12/2001 | Violette et al. | 438/413 |
| 6,380,067 B1 | * | 4/2002 | Subramanian et al. | 438/624 |
| 6,391,720 B1 | * | 5/2002 | Sneelal et al. | 438/259 |
| 6,429,477 B1 | * | 8/2002 | Mandelman et al. | 257/301 |
| 6,436,833 B1 | * | 8/2002 | Pang et al. | 438/692 |
| 6,551,901 B1 | * | 4/2003 | McGrath et al. | 438/424 |
| 6,624,039 B1 | * | 9/2003 | Abdelgadir et al. | 438/401 |
| 6,627,946 B2 | * | 9/2003 | Wang | 257/316 |
| 6,733,955 B1 | * | 5/2004 | Geiger et al. | 430/313 |

OTHER PUBLICATIONS

"Characteristics of CMOS Device Isolation for the ULSI Age", by A. Bryant et al., *Int'l Electron Device Meetings*, pp. 671–674, 1994.

"Three Dimensional DIBL for Shallow–Trench Isolated MOSFET's" C. Wang et al., *IEEE Trans. on Electron Device*, vol. 46, No. 1, pp. 139–144, 1999.

"The Impact of Isolation Pitch Scaling on Vth Fluctuation in DRAM Cell Transistors due to Neighboring Drain/Source Electric Field Penetration," J.H. Sim et al., *Symposium of VLSI Technology*, pp. 32–33, 1998.

(List continued on next page.)

*Primary Examiner*—Michael Lebentritt

(57) ABSTRACT

A method for forming shallow trenches having different trench fill materials is described. A stop layer is provided on a substrate. A plurality of trenches is etched through the stop layer and into the substrate. A first layer is deposited over the stop layer and filling said trenches. The first layer is planarized to the stop layer leaving the first layer within the trenches. The first layer is removed from a subset of the trenches. A second layer is deposited over the stop layer and within the subset of trenches and planarized to the stop layer leaving the second layer within the subset of trenches to complete fabrication of shallow trenches having different trench fill materials. The trench fill materials may be dielectric layers having different dielectric constants or they may be a dielectric layer and a conducting layer. The method can be extended to provide three or more different trench fill materials.

16 Claims, 9 Drawing Sheets

OTHER PUBLICATIONS

"New Mechanical Reliability Issues for Deep Submicron Devices," H. Miura et al., Symp. of Manuf. tech. workshop, Taiwan, pp. 140–141, 1998.

"High–Performance Cell Transistor Design Using Metallic Shield Embedded Shallow Trench Isolation (MSE–STI) for Gbit Generation DRAM's," J.H. Sim et al., *IEEE Trans. on Electron Devices*, vol. 46, No. 6, pp. 1212–1217, 1999.

U.S. patent application TSMC–01–1120/1138, Ser. #10/268,585, filed Oct. 10, 2002 to the same assignee.

"Carrier Mobility Enhancement in Strained Si–on–Insulator Fabricated by Wafer Bonding," L.H. Huang et al., *Symposium VLSI Tech. Dig. Tech. Papers*, Kyoto, Japan, pp. 57–58, 2001.

"Fabrication and Analysis of Deep Submircon Strained–Si N–MOSFET's," by K.Rim et al., *IEEE Trans. Electron Dev*; vol. 47, No. 7, pp. 1406–1415, Jul. 2000.

"Strained Si Surface Channel MOSFETS for High–Performance CMOS Technology," by K.Rim, *ISSCC*, paper #7.3, pp. 116–117, 2001.

"Carrier Mobilites and Process Stability of Strained Si n–and p–MOSFETs on SiGe Virtual Substrates," by M.T. Currie et al., *J. Vacuum Science Technology B*, vol. 19, No. 6, pp. 2268–2279, Nov./Dec. 2001.

"Enhanced Performance in Sub–100 nm CMOSFETs using Strained Epitaxial Silicon–Germamium," Y.C. Yeo et al., *IEDM*, pp. 753–756, 2000.

"SiGe HBT Technology: A New Contender for Si–Based RF and Microwave Circuit Applications," by J.D. Cressler, *IEEE Trans. Microwave and Techniques*, vol. 46, No. 5, pp. 572–589, 1998.

* cited by examiner

SHALLOW TRENCH FILLED WITH TWO OR MORE DIELECTRICS FOR ISOLATION AND COUPLING OR FOR STRESS CONTROL

RELATED PATENT APPLICATION

U.S. patent application Ser. No. 10/444,874 to M. H. Chi et al filed on May 23, 2003.

BACKGROUND OF THE INVENTION

(1) Field of the Invention

The present invention relates to methods of fabricating shallow trench isolation and, more particularly, to methods of fabricating shallow trench isolation filled with two or more dielectrics for isolation, coupling, or stress relief in the fabrication of integrated circuits.

(2) Description of the Prior Art

Shallow-trench isolation (STI) is the most popular isolation scheme for advanced CMOS (e.g. 0.25 um and beyond). However, as the spacing of STI is continuously scaled down to <0.15 um, there is significant field penetration into the channel (or body) area from the bias of adjacent source/drain junctions. This is discussed in "Characteristics of CMOS device isolation for the ULSI age", A. Bryant, W. Hansch, and T. Mii, *International Electron Device Meetings*, p.671, 1994, "Three-dimensional DIBL for shallow-trench isolation MOSFET's", C. Wang, P. Zhang, *IEEE Trans. on Electron Device*, V.46, No. 1, p.139, 1999, and "The impact of isolation pitch scaling on Vth fluctuation in DRAM cell transistors due to neighboring drain/source electric field penetration", J. H. Sim, J. K. Lee, and K. Kim, *Symposium of VLSI technology*, p.32–33, 1998. Therefore, such "non-perfect" isolation from STI can result in undesirable effects, such as threshold voltage (Vt) fluctuations, with increasing impact in future technology with smaller STI spacing.

One way to eliminate such field penetration effect, a metallic-shielded STI, was proposed in "High-performance cell transistor design using metallic shield embedded shallow trench isolation (MSE-STI) for Gbit generation DRAM's", J. H. Sim, J. K. Lee, and K. Kim, *IEEE Transaction on Electron Devices*, Vol. 46, No. 6, p.1212–1217, 1999. In this proposal, a layer of conducting material (e.g. doped poly) fills the isolation trench after liner oxidation. The grounded conducting material in the trench can provide good shielding and therefore can eliminate transistor's narrow-width effect and Vt fluctuations. There is certainly continuous need for better isolation structure and process.

Interestingly, such field penetration effect due to "non-perfect" STI may also be utilized for forming vertical resistors, FETs, and circuits as disclosed in co-pending U.S. patent applications Ser. No. 10/268,465 filed Oct. 10, 2002 to the same inventor. Thus, the coupling effect through STI may also be useful if the coupling through STI is enhanced.

Furthermore, the effect of stress in the active area is discussed in "New mechanical reliability issues for deep-submicron devices", H. Miura and S. Ikeda, *Symposium of manufacturing technology workshop*, Taiwan, p.140–147, 1998. It is desired to control this stress, especially as it relates to isolation formation. Other related literature includes co-pending U.S. patent application Ser. No. 10/444,874 (TSMC-02-161), "Carrier mobility enhancement in strained Si-on-insulator fabricated by wafer bonding" by L. J. Huang et al, *Symposium VLSI Tech., Dig. Tech. Papers*, Kyoto, Japan, p. 57–58, 2001; "Fabrication and analysis of deep sub-micron strained-Si n-MOSFETs", by K. Rim et al, *IEEE Trans. Electron Dev.*, vol. 47, no. 7, p. 1406–1415, July 2000; "Strained Si surface channel MOSFETs for high performance CMOS technology", by K. Rim, ISSCC, paper #7.3, p. 116–117, 2001; "Carrier mobility and process stability of strained Si n- and p-MOSFETs on SiGe virtual substrates", by M. T. Currie et al, *J. Vacuum Science Technology B*, vol. 19, no. 6, p.2268, November/December 2001; "Enhanced performance in sub-100 nm CMOSFETs using strained epitaxial Silicon-Germanium", by Y. C. Yeo et al, *IEDM*, p. 753, 2000; "SiGe HBT technology: a new contender for Si-based RF and microwave circuit applications", by J. D. Cressler, *IEEE Trans. Microwave and Techniques*, V. 46, No. 5, p.572–589. Related patents include U.S. Pat. No. 6,297,128 to H. S. Kim et al and U.S. Pat. No. 6,037,237 to M. H. Park et al.

U.S. Pat. No. 6,074,909 to Gruening shows a STI and a vertical transistor process. U.S. Pat. No. 6,255,176B1 to Kim et al shows a STI with a high dielectric constant material. U.S. Pat. No. 6,194,283B1 to Gardner et al discloses a low dielectric constant spacer layer in a STI process. U.S. Pat. No. 5,742,091 to Hebert shows a low dielectric constant material as a liner or as a fill layer in a STI process.

SUMMARY OF THE INVENTION

According, it is an object of the invention that shallow trench isolation regions on the same chip are filled with two or more different dielectric materials.

It is another object of the invention that one shallow trench is filled with a low dielectric constant (k) material for isolation and another shallow trench be filled with a high k material for coupling on the same chip.

Another object of the invention is to provide a method for fabricating shallow trenches filled with two or more different dielectric materials.

Yet another object is to provide a method for fabricating shallow trenches filled with two or more different materials.

A further object of the invention is to provide a method of fabricating a capacitor structure formed by a shallow trench filled with a high k material.

A still further object is to provide a method of fabricating a vertical transistor formed by a shallow trench filled with a high k material.

Yet another object is to provide a method for controlling stress in the silicon active area of an integrated circuit by filling shallow trenches with dielectrics having different thermal expansion coefficients.

In accordance with the objects of this invention, a method for forming shallow trenches having different trench fill materials is achieved. A stop layer is provided on a substrate. A plurality of trenches is etched through the stop layer and into the substrate. A first layer is deposited over the stop layer and filling said trenches. The first layer is planarized to the stop layer leaving the first layer within the trenches. The first layer is removed from a subset of the trenches. A second layer is deposited over the stop layer and within the subset of trenches and planarized to the stop layer leaving the second layer within the subset of trenches to complete fabrication of shallow trenches having different trench fill materials. The trench fill materials may be dielectric layers having different dielectric constants or they may be a dielectric layer and a conducting layer. The method can be extended to provide three or more different trench fill materials.

Also in accordance with the objects of the invention, a method for fabricating a n+ to n+ capacitor is achieved. A stop layer is provided on a substrate. A plurality of trenches is etched through the stop layer and into the substrate. A first layer is deposited over the stop layer and filling the trenches wherein the first layer comprises a dielectric material having a first dielectric constant. The first layer is planarized to the stop layer leaving the first layer within the trenches. The first layer is removed from a subset of the trenches. A second layer is deposited over the stop layer and within the subset of trenches wherein the second layer comprises a dielectric material having a second dielectric constant higher than the first dielectric constant. The second layer is planarized to the stop layer leaving the second layer within the subset of trenches. N+ junctions are formed on either side of one of the subset of trenches wherein the trench forms a capacitor dielectric of the n+ to n+ capacitor. A p+ to p+ capacitor can be formed in a similar way within an n-well.

Also in accordance with the objects of the invention, a method for fabricating a vertical MOSFET is provided. A deep n-well is formed within a substrate. A stop layer is provided on the substrate. A plurality of trenches is etched through the stop layer and into the substrate. A first layer is deposited over the stop layer and filling the trenches wherein the first layer comprises a dielectric material having a first dielectric constant. The first layer is planarized to the stop layer leaving the first layer within the trenches. The first layer is removed from a subset of the trenches. A second layer is deposited over the stop layer and within the subset of trenches wherein the second layer comprises a dielectric material having a second dielectric constant higher than the first dielectric constant. The second layer is planarized to the stop layer leaving the second layer within the subset of trenches. Within the deep n-well, a first n+ junction is formed on one side of one of the subset of trenches, called a high-k trench, and a p-well is formed underlying the first n+ junction wherein the p-well forms the body of a vertical MOSFET device. A second gate n+ junction is formed on another side of the high-k trench wherein the second n+ junction is formed deeper than the first n+ junction and wherein a p-base is formed underlying the second n+ junction wherein the vertical MOSFET device is turned on by forming an inversion layer at a sidewall of the body adjacent to the high-k trench. A vertical PMOSFET can be fabricated in a similar way using a deep p-junction as the gate in a p-substrate with an n-base implant.

Also in accordance with the objects of the invention, a method for controlling stress in silicon active areas is provided. A stop layer is provided on a substrate. A plurality of trenches is etched through the stop layer and into the substrate. A first layer is deposited over the stop layer and filling the trenches wherein the first layer comprises a dielectric material having a thermal coefficient higher than that of silicon. The first layer is planarized to the stop layer leaving the first layer within the trenches. The first layer is removed from a subset of the trenches wherein the subset of the trenches surrounds second silicon active areas and wherein the remaining trenches surround first silicon active areas. A second layer is deposited over the stop layer and within the subset of trenches wherein the second layer comprises a dielectric material having a thermal coefficient lower than that of silicon. The second layer is planarized to the stop layer leaving the second layer within the subset of trenches wherein controlled tensile stress is applied to the first silicon active areas and wherein controlled compressive stress is applied to the second silicon active areas.

Also in accordance with the objects of the invention, a method for controlling stress in a silicon active area is achieved. A stop layer is provided on a substrate. A plurality of trenches is etched through the stop layer and into the substrate wherein the trenches surround a silicon active area. A first layer is deposited over the stop layer and filling the trenches wherein the first layer comprises a dielectric material having a thermal coefficient higher than that of silicon. The first layer is planarized to the stop layer leaving the first layer within the trenches. The first layer is removed from a subset of the trenches wherein the subset of trenches surround the silicon active area in a first direction and wherein the remaining trenches surround the silicon active area in a second direction perpendicular to the first direction. A second layer is deposited over the stop layer and within the subset of trenches wherein the second layer comprises a dielectric material having a thermal coefficient lower than that of silicon. The second layer is planarized to the stop layer leaving the second layer within the subset of trenches wherein compressive stress is applied to the silicon active area in the first direction and tensile stress is applied to the silicon active area in the second direction.

BRIEF DESCRIPTION OF THE DRAWINGS

In the following drawings forming a material part of this description, there is shown.

DESCRIPTION OF THE PREFERRED EMBODIMENTS

With the limitations of STI with small spacing in advanced CMOS, one can eliminate the "field penetration effect" by filling the shallow trench with low-k dielectric. Also, the "field penetration effect" can be enhanced by the shallow trench filled with high-k dielectric materials, so that many useful devices (e.g. vertical capacitor, resistor, and transistors) can be formed. In this proposal, a new scheme and fabrication method are presented to form the shallow trenches filled with low-k dielectric (for isolation) or high-k dielectric (for coupling) on the same chip. This is discussed according to a first preferred embodiment of the invention shown in FIG. 1. The second preferred embodiment, shown in FIG. 11, provides a new capacitor structure formed by a shallow trench of the present invention. The third preferred embodiment, shown in FIG. 12, provides a new vertical transistor formed by a shallow trench of the present invention. Also, ways to control the stress in the silicon active area is proposed by using dielectrics with large or small expansion coefficients (with respect to that of silicon) is shown in the fourth preferred embodiment. The process of the present invention is useful at dimensions of about 0.1 μm and smaller. In these ways, it is promising that future advanced CMOS technology (beyond 0.1 um generation) can have both good isolation (for CMOS devices and circuits) and new vertical devices and circuits based on coupling; furthermore, stress in the active area can also be controlled for optimized transistor performance.

Figure 1:
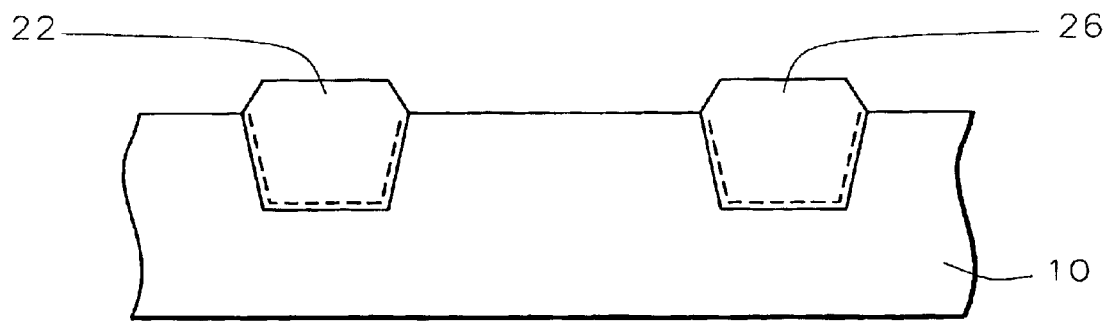
FIG. 1 is a schematic cross-sectional representations of a first preferred embodiment of the present invention.

The process of the present invention will now be discussed in accordance with the first preferred embodiment of the present invention and with reference to FIGS. 1–10. A shallow trench scheme filled with dual dielectrics is illustrated in FIG. 1.

The shallow-trench isolation (STI) is the most popular isolation scheme for advanced CMOS (e.g. 0.25 $\mu$m and beyond). However, as the spacing of STI is continuously scaled down to <0.15 $\mu$m, there is significant field penetration into the channel (or body) area from the bias of adjacent source/drain junctions. Therefore, such "non-perfect" isolation from STI can result in undesirable effects (e.g. "Vt fluctuations") with increasing impact in future technology with smaller STI spacing. Interestingly, such field penetration effect due to "non-perfect" STI may also be utilized for forming vertical resistors, FETs, and circuits. Thus, the coupling effect through STI may also be useful if the coupling through STI is enhanced.

With the two effects of STI with small spacing in mind, one can understand that the shallow trench may serve two purposes, one is for isolation of transistors, and the other for coupling from adjacent junctions. Therefore, it is clear that there is a need for shallow trench with dual material filling in the trench. The isolation capability can be enhanced by a shallow trench filled with low-k dielectric materials. The coupling effect can be enhanced by a shallow trench filled with high-k materials. In this way, it is promising that future advanced CMOS technology (beyond 0.1 $\mu$m generations) can have both good isolation for CMOS devices and circuits, as well as new vertical devices and circuits based on coupling.

Realizing that the shallow trench with small spacing in advanced CMOS needs to have good isolation capability and it also can serve as coupling for useful vertical devices, we propose a new scheme of "shallow-trench" filled with low-k dielectrics for isolation and high-k dielectric for coupling.

The process of the present invention for forming shallow trenches filled with different materials illustrated in FIGS. 2–10. The process of the present invention is compatible with conventional STI flow by adding a few steps for removing the $1^{st}$ dielectric and then filling with the $2^{nd}$ dielectric as shown in FIGS. 2–10.

Figure 2:
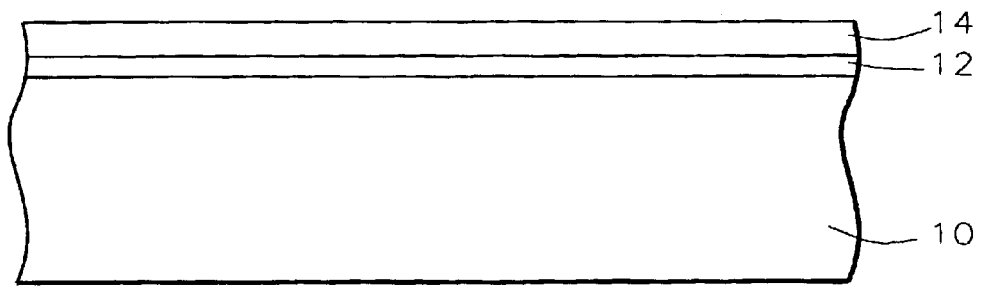
FIGS. 2 through 10 are schematic cross-sectional representations of a preferred embodiment of the process of the present invention.
Figure 3:
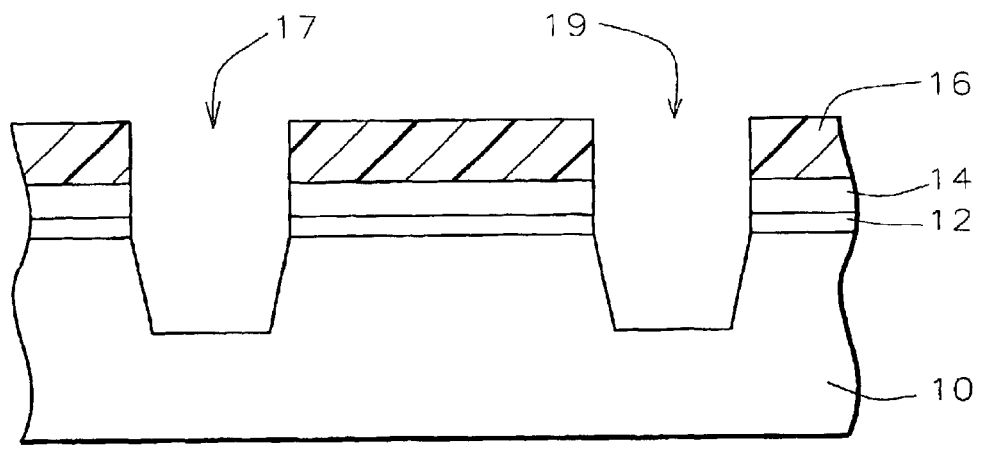

Referring now more particularly to FIG. 2, semiconductor substrate 10 is illustrated. The semiconductor substrate preferably comprises silicon. The substrate is cleaned, followed by the formation of a pad-oxide layer 12 having a thickness of between about 80 and 150 Angstroms and a nitride layer 14 having a thickness of between about 800 and 1500 Angstroms. Then, a masking step for protection of the active area is performed. Photoresist mask 16 is shown in FIG. 3. A plasma etching of nitride, pad-oxide, and silicon is performed to form trenches 17 and 19 having a depth of 0.3 $\mu$m to 05 $\mu$m, as shown in FIG. 3.

Figure 4:
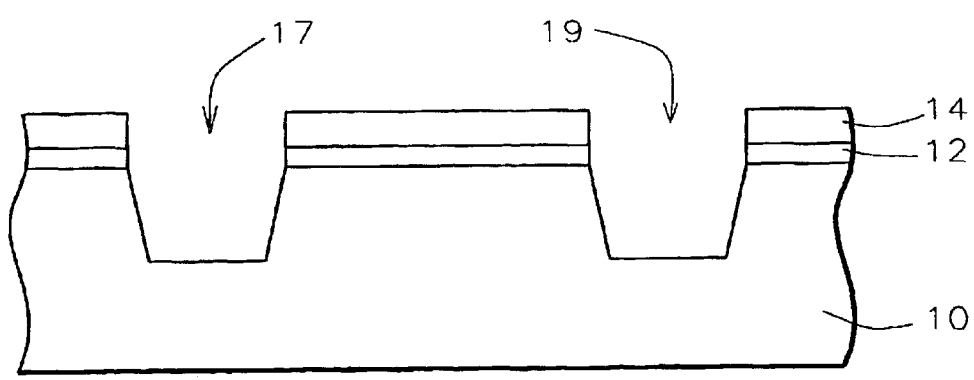
Figure 5:
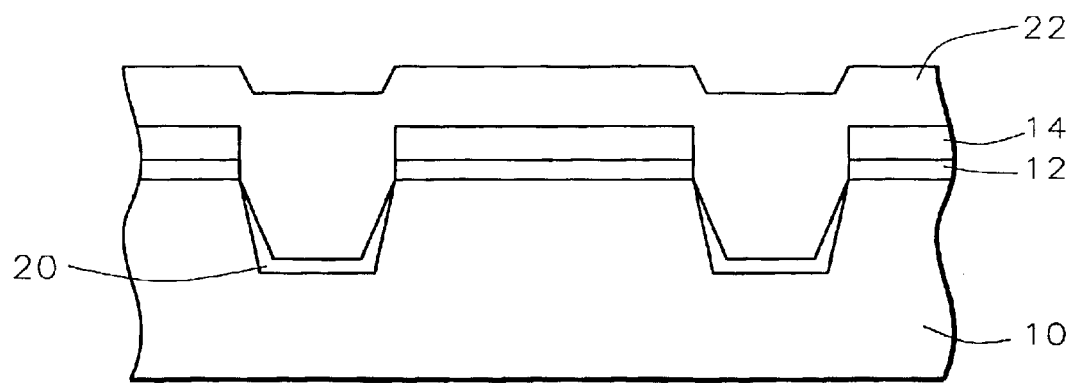

The photoresist mask 16 is removed, as shown in FIG. 4. Now, a liner oxide 20 is formed within the trenches to a thickness of between about 100 and 200 Angstroms, as illustrated in FIG. 5. The first dielectric layer 22 is deposited, followed by annealing. The first dielectric layer may preferably be a low-k dielectric material (e.g. fluorinated high density plasma (HDP) oxide). Note that conventional STI trench filling uses oxide with a dielectric constant of about 3.9, which is considered to be low-k. The trench is filled by various methods, e.g. chemical vapor deposition (CVD), sub-atmospheric pressure chemical vapor deposition (SACVD), high density plasma chemical vapor deposition (HDP-CVD), etc. In the process of the present invention, the first dielectric layer may even be those materials with a dielectric constant lower than oxide, such as Fluorine contained CVD oxide (k~3.0–3.5), spin-on low-k dielectrics (k~2–3), etc. The annealing step after the low-k dielectric deposition is important for densification of the dielectric material.

Figure 6:
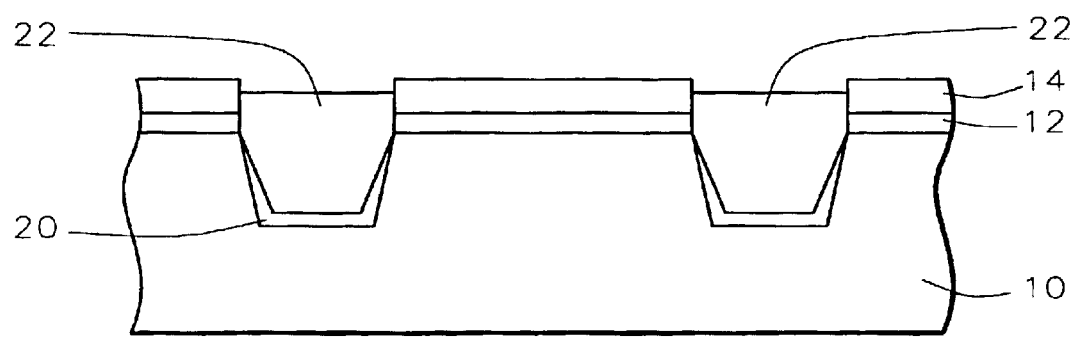
Figure 7:
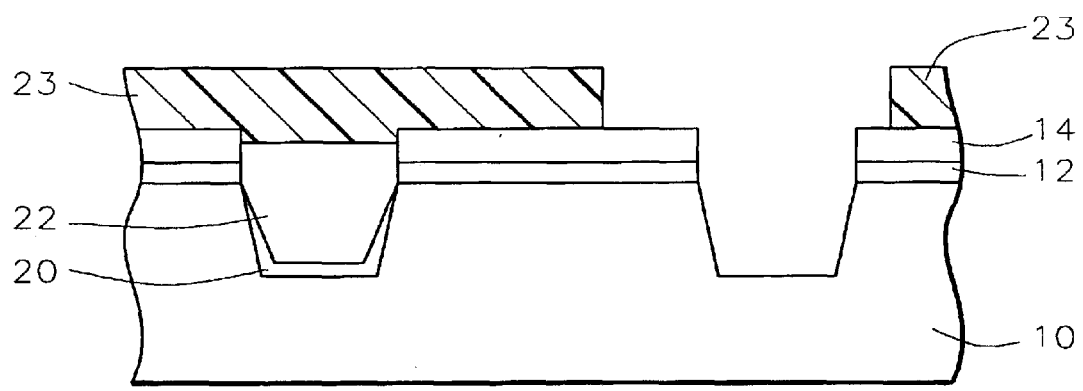

Referring now to FIG. 6, a chemical mechanical polishing (CMP) planarization is performed using nitride as the stopping layer. Now as shown in FIG. 7, a second photoresist mask 23 is formed over the substrate having openings over those trenches to be filled by the second dielectric material. The first dielectric layer is etched away within the exposed trenches by either a wet or plasma etching. This is a self-aligned etching step, using the nitride 14 as a hard mask.

Figure 8:
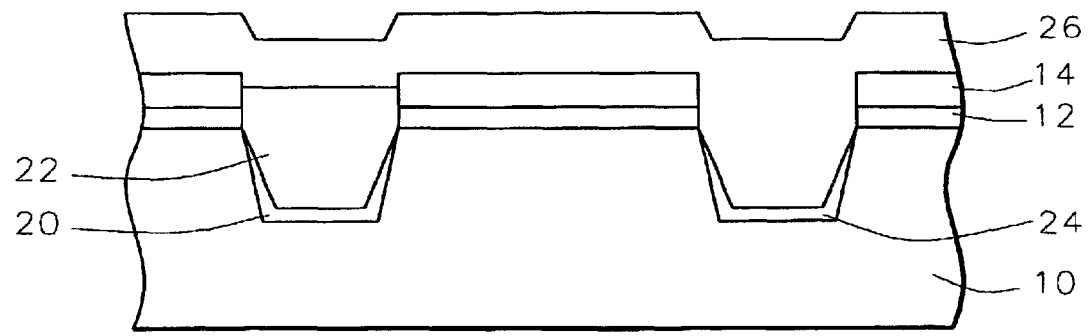
Figure 9:
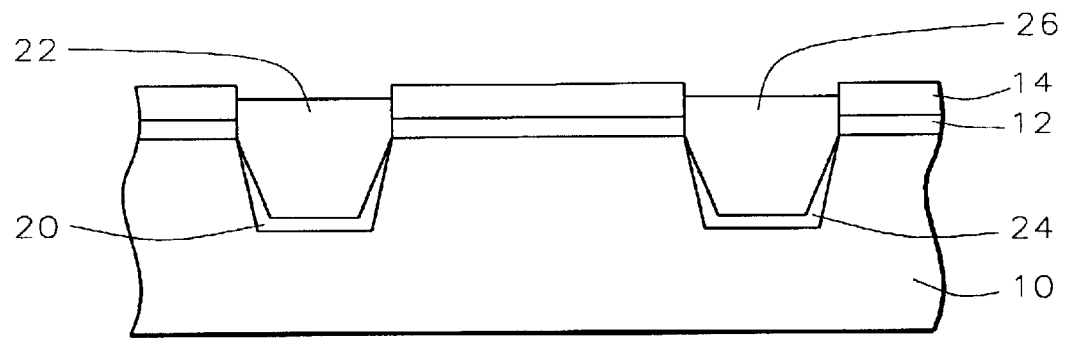

The photoresist mask 23 is removed and a second liner-oxide layer 24 is grown within the exposed trenches. This liner layer 24 is grown to a thinner thickness than the first liner layer 20. The preferred thickness is between about 40 and 80 Angstroms. Then, as shown in FIG. 8, a second dielectric layer 26 is deposited. The second dielectric layer is preferably a high-k dielectric material. This leads to the desirable thinner liner layer 24 of oxide for overall better coupling effect. Note that the liner oxide layer is needed for passivating the surface of trenches after etching. Some promising high-k materials include $Al_2O_5$, $Ta_2O_5$ (k~25), $HfO_2$(k~30), ... etc. with k>20. Then, CMP with a stop on nitride is performed for planarizing the second dielectric layer, as shown in FIG. 9.

Figure 10:
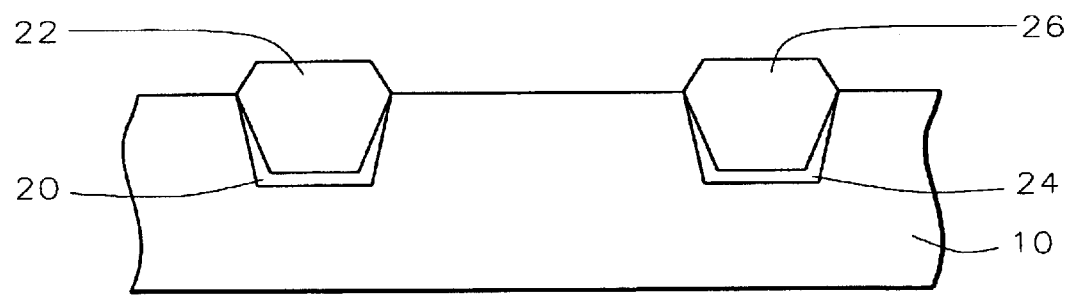

After SiN removal and pad oxide dip, the completed trenches, filled with low-k material 22 and high-k material 26, are illustrated in FIG. 10. Processing continues as conventional in the art to form integrated circuit devices.

The process of the present invention can be extended in a number of ways. For example, the first dielectric for filling the trenches may be a high-k material while a low-k material can be the second dielectric. Furthermore, the flow is also applicable if a third dielectric material (or more) is desirable by repeating the process loop in FIGS. 7–9 (i.e. masking, etching, third dielectric deposition, and planarization by CMP). Furthermore, other materials including conducting materials, such as polysilicon (doped or un-doped) or nitrides (TaN, TiN, ... etc.) can be included as one of the materials to fill trenches and may serve a shielding purpose. Still furthermore, all fabrication methods can also be applicable to silicon-on-insulator (SOI) wafers.

Figures 11A, 11B:
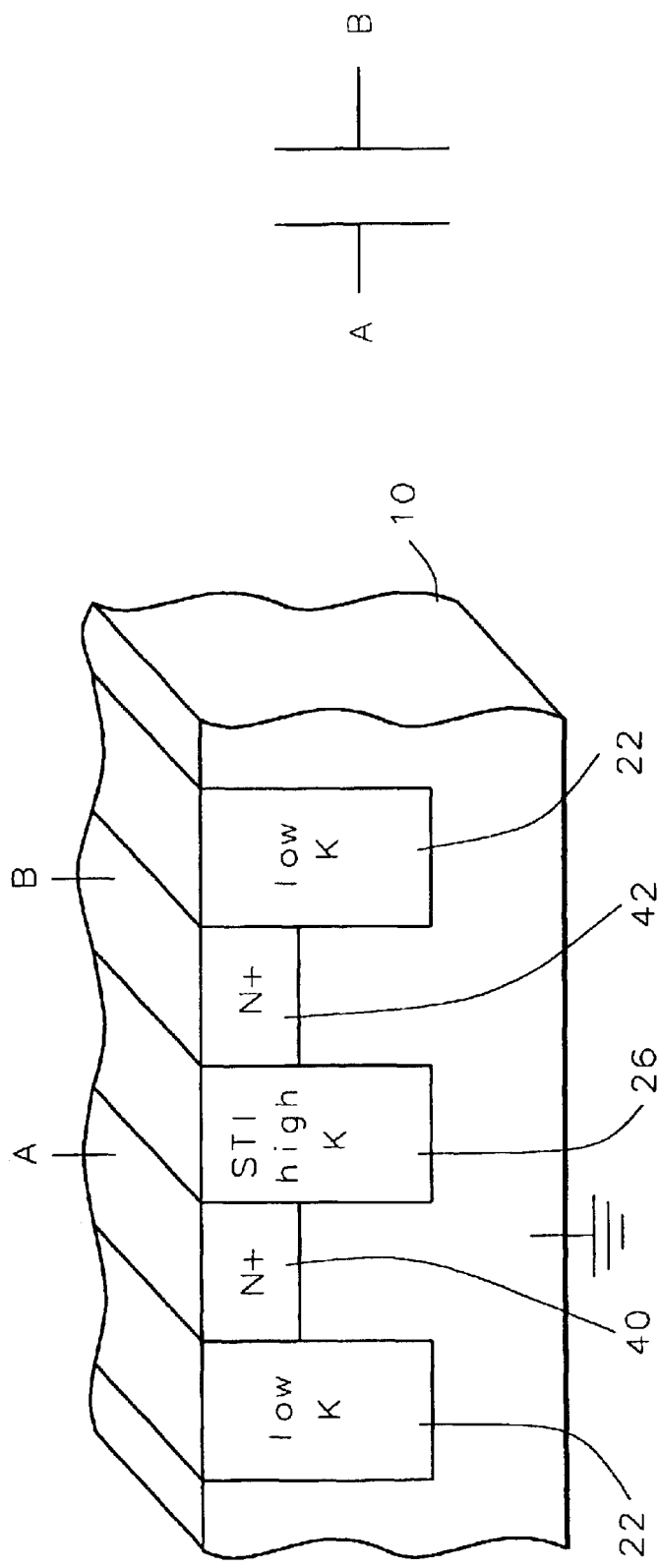
FIG. 11A is an isometric view of a second preferred embodiment of the present invention.
FIG. 11B is a circuit diagram of the capacitor of FIG. 11A.

The second preferred embodiment of the present invention will be described with reference to FIG. 11. One new application according to the process of the present invention, is a vertical capacitor between n+ junctions spaced by shallow trench filled with high-k dielectrics. FIG. 11A illustrates a substrate 10 in which trenches have been formed according to the process of the present invention described above. Trenches 22 contain low-k dielectric material while trench 26 contains high-k dielectric material. N+ junctions 40 and 42 form the capacitor electrodes. The STI region 26 forms the capacitor dielectric separating the two electrodes. The high-k dielectric material should have a k value greater than about 7.0 (i.e., higher than typical oxide dielectric constants. Thus, silicon nitride is considered as a high-k material with its k value of 7.5).

The magnitude of the capacitor is related to the spacing of the trench, the dielectric constant of filling materials, and certainly the area (facing the STI sidewall) of the n+ junctions. Note that the n+ junctions can be made deeper by adding additional implants with high enough energy. Such a capacitor is useful for "two-sided applications" with both nodes biasing with full swing from 0 v to Vcc. A similar p+ to p+ capacitor (not shown) can be formed within an n-well with both nodes capable of swinging to negative voltages. FIG. 11B shows a notation of the capacitor in the structure described in FIG. 11A.

Figures 12A, 12B:
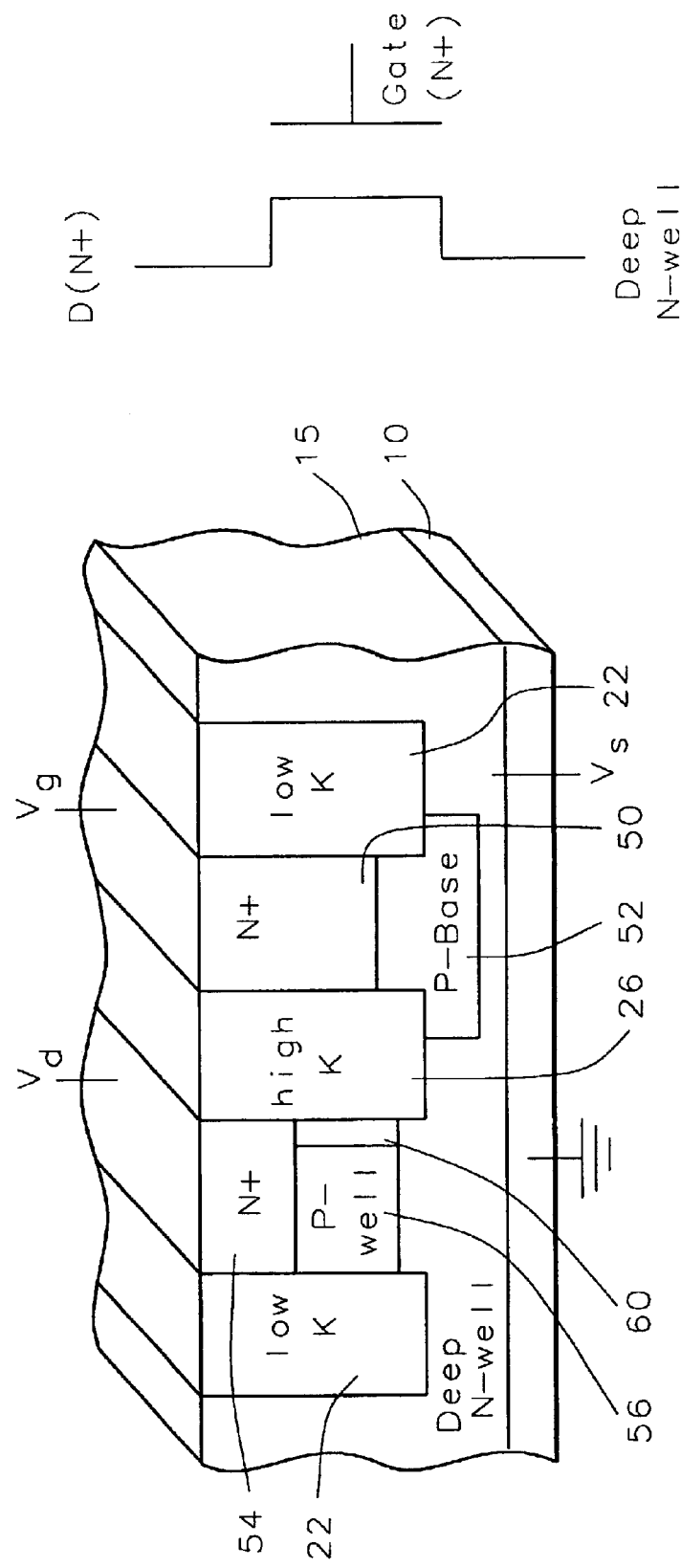
FIG. 12A is an isometric view of a third preferred embodiment of the present invention.
FIG. 12B is a circuit diagram of the vertical MOS device of FIG. 12A.

The third preferred embodiment of the present invention will be described with reference to FIG. 12. Another new application of the process of the present invention is a vertical n-MOS formed with a deep n+ junction as the gate spaced by a shallow trench filled with high-k material. FIG. 12A illustrates substrate 10. A deep N-well 15 has been formed within the substrate. The n+ gate junction 50 is deep and isolated from the deep n-well 15 by a p-base 52. The deep n+ gate junction and the p-base are formed using sequential implants (i.e. deep phosphorus implant followed by Boron implant or vice versa using proper energy during implantation) at the same masking step. The p-well 56 serves as the body of the vertical MOS. N+ junction 54 forms the drain of the device while the deep N-well 15 is the source. The vertical n-MOS is turned on by forming an inversion layer 60 on the surface of the channel 56 along the sidewall. Such vertical n-MOS devices can be used in "common source" circuits or as switches. Similarly, a vertical p-MOS (not shown) is formed with deep p+ junction, with a n-base implant, as the gate in the p-substrate. As above, the high-k material should have a k value of greater than about 7.0. FIG. 12B shows a circuit notation of the vertical n-MOS as described in FIG. 12A.

Figure 13:
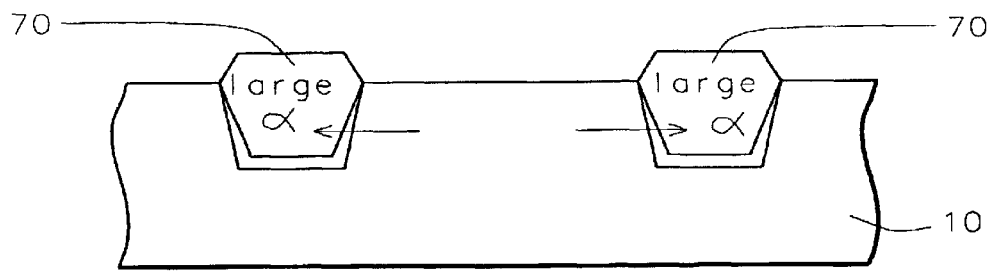
FIGS. 13 and 14 are schematic cross-sectional representations of a fourth preferred embodiment of the present invention.
Figure 14:
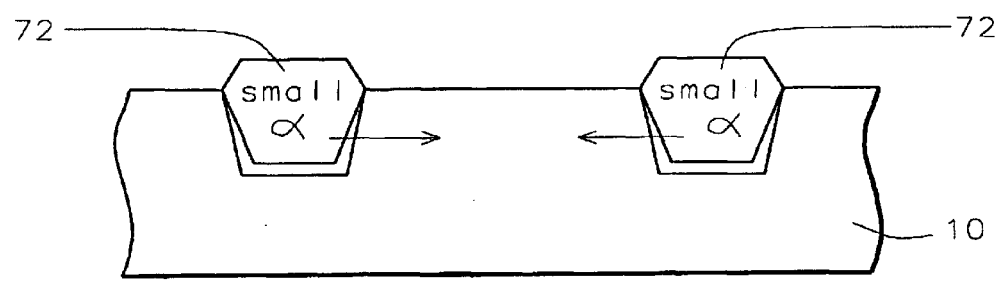
Figure 15:
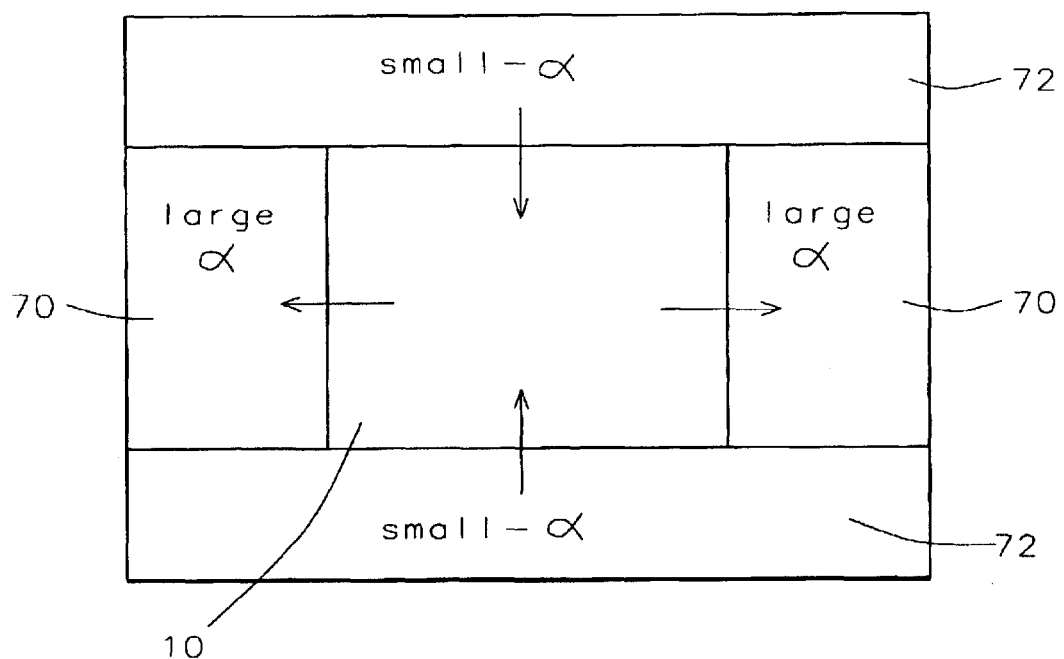
FIG. 15 is a top view of a fourth preferred embodiment of the present invention.

The fourth preferred embodiment of the present invention will be described with reference to FIGS. 13–15. The process of the present invention can be used to control stress in the silicon active area. Shallow trenches can also be filled by dielectrics with different thermal expansion coefficients so that the stress in the silicon active area may be controlled. Material with larger thermal expansion than silicon is referred to as "large-$\alpha$"; and material with smaller thermal expansion than silicon is referred to as "small-$\alpha$". If the active area is surrounded by trenches filled with large-$\alpha$ dielectric, then the dielectric will shrink faster than silicon during cooling down from the elevated temperature of deposition or annealing. The active area will experience a tensile force laterally toward the trench as shown in FIG. 13. Similarly, if the active area is surrounded by trenches filled with "small-$\alpha$" dielectric, then the dielectric will shrink slower than silicon during cooling down from the elevated temperature of deposition or annealing. The active area will then experience a compressive force from the trench laterally as shown in FIG. 14. Furthermore, if the active area is surrounded by trenches filled with both "small-$\alpha$" and "large-$\alpha$" dielectrics in a symmetrical manner, then the active area will experience tensile stress in one direction and compressive stress in another direction as illustrated in top view in FIG. 15.

Prior art methods for controlling stress are very complex. The process of the present invention provides a simple and effective method for controlling stress in the silicon active area. Controlling stress provides the ability to enhance device performance (e.g. Idsat) by enhancing the electron and hole mobility. The Idsat of an n-MOSFET can be increased significantly by applying tensile stress along the channel area due to electron mobility increase. The Idsat of p-MOSFET can be increased significantly by applying compressive stress along the channel area due to hole mobility increase. It is also known that tensile stress can enhance hold mobility, but compressive stress is more effective. For best CMOS performance, the n-MOSFET and p-MOSFET can be optimized under tensile and compressive stress respectively. There are other stress-related effects that are desirable; e.g. shallower junction formation for p-type under compressive stress. Large-$\alpha$ dielectrics include dielectrics having an $\alpha$ value ($K^{-1}$) of greater than about 2.8 E-6 such as silicon nitride, silicon carbide, aluminum nitride, aluminum oxide, steatite ($MgOSiO_2$), and zirconium oxide. Small-$\alpha$ dielectrics such as silicon dioxide have an $\alpha$ value of less than about 2.0E-6.

The process of the present invention provides a method for forming shallow trenches containing different materials. The materials can be low-k and high-k dielectrics or even conducting materials. Using the process of the invention, new devices can be fabricated, such as a capacitor structure and a vertical MOSFET. Also, stress control in the silicon active area can be achieved according to the process of the present invention.

While the invention has been particularly shown and described with reference to the preferred embodiments thereof, it will be understood by those skilled in the art that various changes in form and details may be made without departing form the spirit and scope of the invention.

What is claimed is:

1. A method for forming shallow trenches having different trench fill materials comprising:

providing a stop layer on a substrate;

etching a plurality of trenches through said stop layer and into said substrate;

depositing a first layer over said stop layer and filling said trenches;

planarizing said first layer to said stop layer leaving said first layer within said trenches;

thereafter removing said first layer from a subset of said trenches;

depositing a second layer over said stop layer and within said subset of trenches; and planarizing said second layer to said stop layer leaving said second layer within said subset of trenches to complete fabrication of said shallow trenches having different trench fill materials.

2. The method according to claim 1 further comprising forming a pad oxide layer underlying said stop layer.

3. The method according to claim 1 wherein said stop layer comprises silicon nitride.

4. The method according to claim 1 wherein said first layer has a dielectric constant higher than said second layer.

5. The method according to claim 1 wherein said first layer has a dielectric constant lower than said second layer.

6. The method according to claim 1 further comprising:

a) removing said first layer from a second subset of said trenches;

b) depositing a third layer over said stop layer and within said second subset of trenches;

c) planarizing said third layer to said stop layer leaving said third layer within said second subset of trenches; and repeating said steps a–c to form any number of subsets of said trenches filled with any number of different materials.

7. The method according to claim 1 wherein said second layer comprises a conducting material.

8. The method according to claim 1 wherein said substrate is a silicon-on-insulator wafer.

9. The method according to claim 1 wherein one of said first and second layers has a higher dielectric constant than the other of said first and second layers and further comprising:
   forming n+ junctions on either side of one of said trenches filled with said one of said first and second layers having said higher dielectric constant wherein a n+ to n+ capacitor is formed.

10. The method according to claim 1 wherein one of said first and second layers has a higher dielectric constant than the other of said first and second layers and further comprising:
    forming an n-well within said substrate; and
    forming p+ junctions within said n-well on either side of one of said trenches filled with said one of said first and second layers having said higher dielectric constant wherein a p+ to p+ capacitor is formed.

11. The method according to claim 1 wherein one of said first and second layers has a higher dielectric constant than the other of said first and second layers and further comprising:
    forming a deep n-well within said substrate;
    forming within said deep n-well a first n+ junction on one side of one of said trenches filled with said one of said first and second layers having said higher dielectric constant, called a high-k trench, and forming a p-well underlying said first n+ junction wherein said p-well forms the body of a vertical MOSFET device; and
    forming within said deep n-well a second gate n+ junction on another side of said high-k trench wherein said second n+ junction is formed deeper than said first n+ junction and wherein a p-base is formed underlying said second n+ junction;
    wherein said vertical MOSFET device is turned on by forming an inversion layer at a sidewall of said body adjacent to said high-k trench.

12. The method according to claim 1 wherein one of said first and second layers has a higher dielectric constant than the other of said first and second layers and further comprising:
    forming a first p+ junction on one side of one of said trenches filled with said one of said first and second layers having said higher dielectric constant, called a high-k trench, and forming a n-well underlying said first p+ junction wherein said n-well forms the body of a vertical MOSFET device; and
    forming a second gate p+ junction on another side of said high-k trench wherein said second n+ junction is formed deeper than said first p+ junction and wherein a n-base is formed underlying said second p+ junction;
    wherein said vertical MOSFET device is turned on by forming an inversion layer at a sidewall of said body adjacent to said high-k trench.

13. The method according to claim 1 wherein said subset of trenches surrounds a silicon active area and wherein said second dielectric layer has a thermal coefficient different from that of silicon wherein controlled stress is applied to said active area.

14. The method according to claim 13 wherein said thermal coefficient of said second dielectric layer is larger than that of silicon and wherein said stress applied is tensile stress.

15. The method according to claim 13 wherein said thermal coefficient of said second dielectric layer is smaller than that of silicon and wherein said stress applied is compressive stress.

16. The method according to claim 1 wherein said subset of trenches surround a silicon active area in a first direction and wherein some of remaining said trenches surround said silicon active area in a second direction perpendicular to said first direction, wherein said first dielectric layer has a thermal coefficient larger that of silicon, wherein said second dielectric layer has a thermal coefficient smaller than that of silicon, and wherein compressive stress is applied to said silicon active area in said first direction and tensile stress is applied to said silicon active area in said second direction.

* * * * *